United States Patent [19]

Okano et al.

[11] Patent Number: 5,385,763

[45] Date of Patent: Jan. 31, 1995

[54] METHOD FOR FORMING A FILM ON A SUBSTRATE BY ACTIVATING A REACTIVE GAS

[75] Inventors: Haruo Okano, Tokyo; Sadahisa Noguchi, Fuchu; Makoto Sekine, Yokohama, all of Japan

[73] Assignee: Kabushiki Kaisha Toshiba, Kanagawa, Japan

[21] Appl. No.: 203,757

[22] Filed: Mar. 1, 1994

Related U.S. Application Data

[60] Continuation of Ser. No. 917,531, Jul. 20, 1992, abandoned, which is a division of Ser. No. 686,283, Apr. 16, 1991, Pat. No. 5,156,881, which is a continuation of Ser. No. 169,577, Mar. 17, 1988, abandoned.

[30] Foreign Application Priority Data

Mar. 18, 1987 [JP] Japan ................................. 62-61237
Mar. 18, 1987 [JP] Japan ................................. 62-61238

[51] Int. Cl.⁶ ............................................. B05D 3/06
[52] U.S. Cl. .................... 427/572; 427/573; 427/575; 427/576; 427/578; 427/579; 427/596; 437/67; 437/919; 148/DIG. 50
[58] Field of Search ............... 427/572, 573, 575, 576, 427/578, 579, 596; 437/67, 919; 148/DIG. 50

[56] References Cited

U.S. PATENT DOCUMENTS

| | | |
|---|---|---|
| 4,009,680 | 3/1977 | Fengler . |
| 4,501,225 | 2/1985 | Nagao et al. . |
| 4,645,564 | 2/1987 | Morie et al. .................. 156/643 |
| 4,673,592 | 6/1987 | Porter et al. . |
| 4,675,205 | 6/1987 | Boncoeur et al. . |
| 4,743,570 | 5/1988 | Lamont, Jr. . |
| 4,747,928 | 5/1988 | Takahashi et al. . |
| 4,800,174 | 1/1989 | Ishihara et al. . |

FOREIGN PATENT DOCUMENTS

| | | |
|---|---|---|
| 0049586 | 4/1982 | European Pat. Off. . |
| 59-163831 | 9/1984 | Japan . |
| 63-58925 | 3/1988 | Japan . |
| 63-125680 | 5/1988 | Japan . |

OTHER PUBLICATIONS

Patent Abstract of Japan, vol. 15, No. 40, to Japanese Patent Document No. 02-277238 dated Jan. 30, 1991.

*Primary Examiner*—Roy V. King
*Attorney, Agent, or Firm*—Finnegan, Henderson Farabow, Garrett & Dunner

[57] ABSTRACT

A thin film forming method comprises the steps of supporting a semiconductor substrate having a trench or an unevenness thereon in a reaction vessel; introducing a reactive gas into the vessel; activating the reactive gas to form a deposit species, the deposit species characterized by a phase diagram including a liquid phase region defined by a melting curve and an evaporation curve that intersect at a triple point; and forming a thin film containing at least part of the deposit species on the substrate while retaining a pressure in the vessel higher than the triple point of the phase diagram of the deposit species, and retaining a temperature of the substrate within the liquid phase region of the phase diagram of the deposit species.

42 Claims, 16 Drawing Sheets

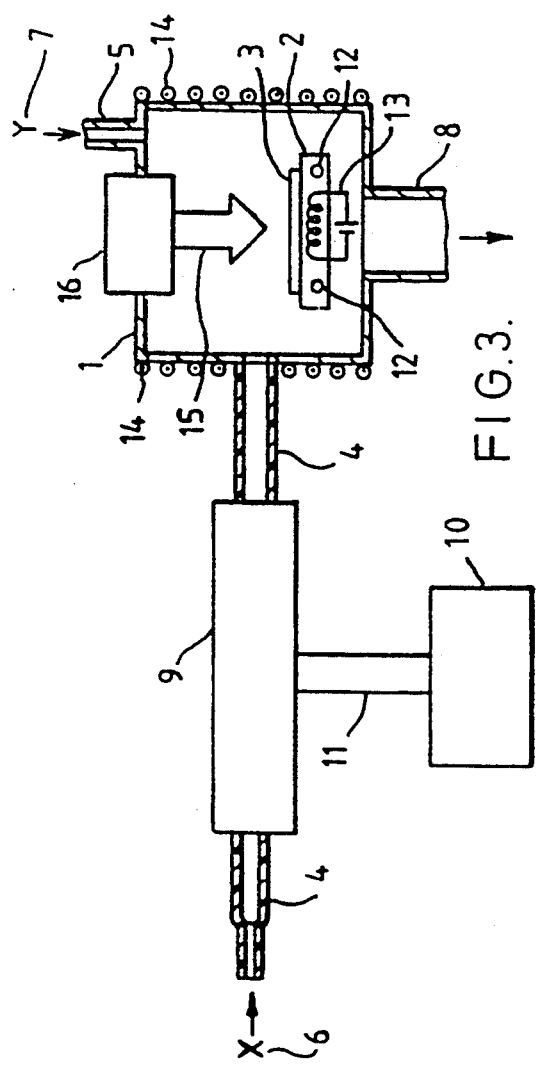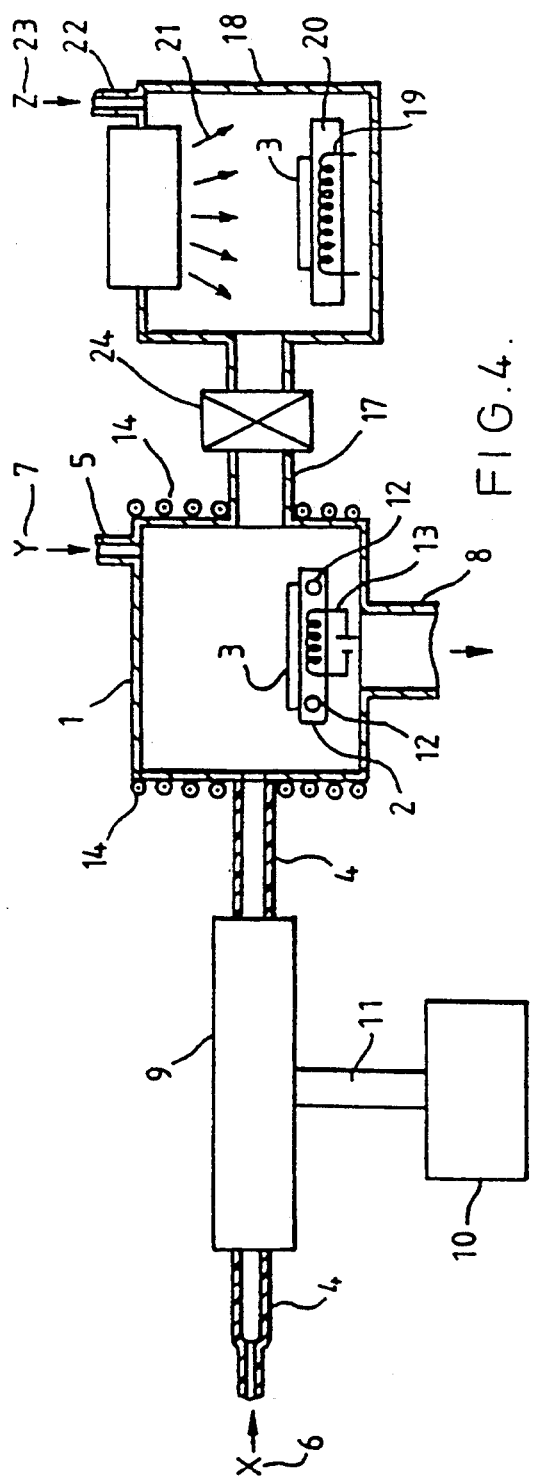

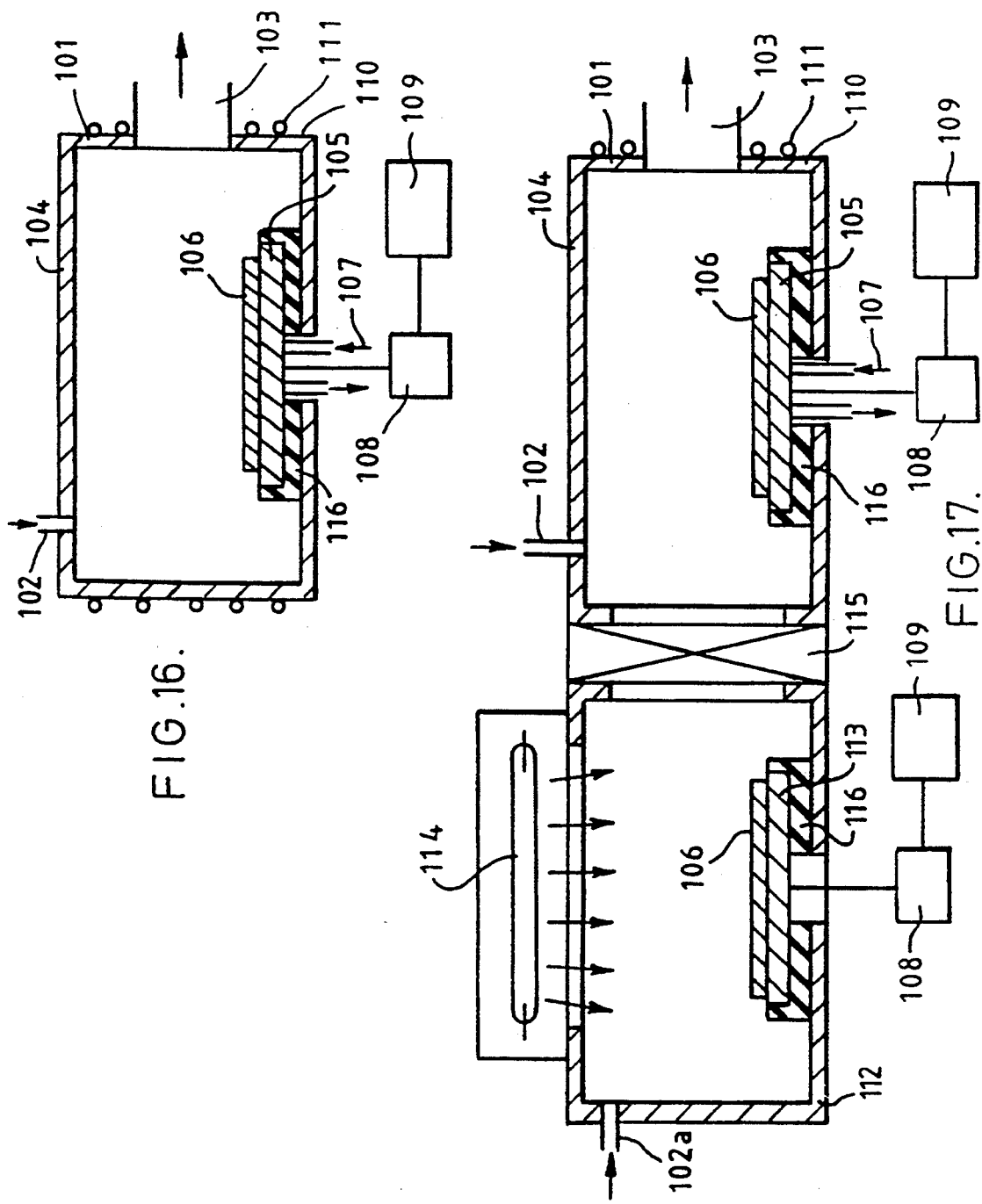

TIME CHANGES →

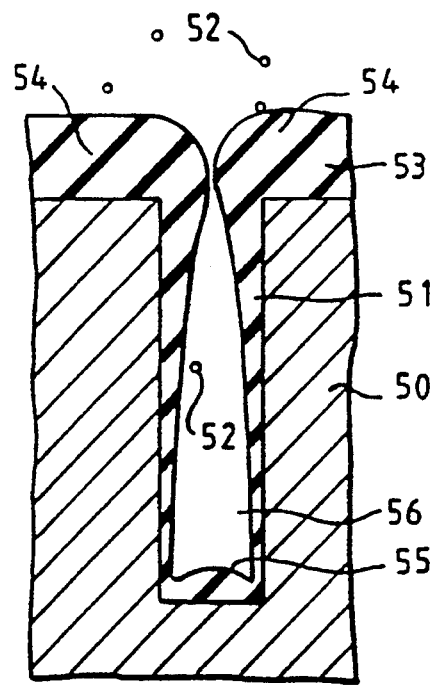
FIG. 22.
PRIOR ART
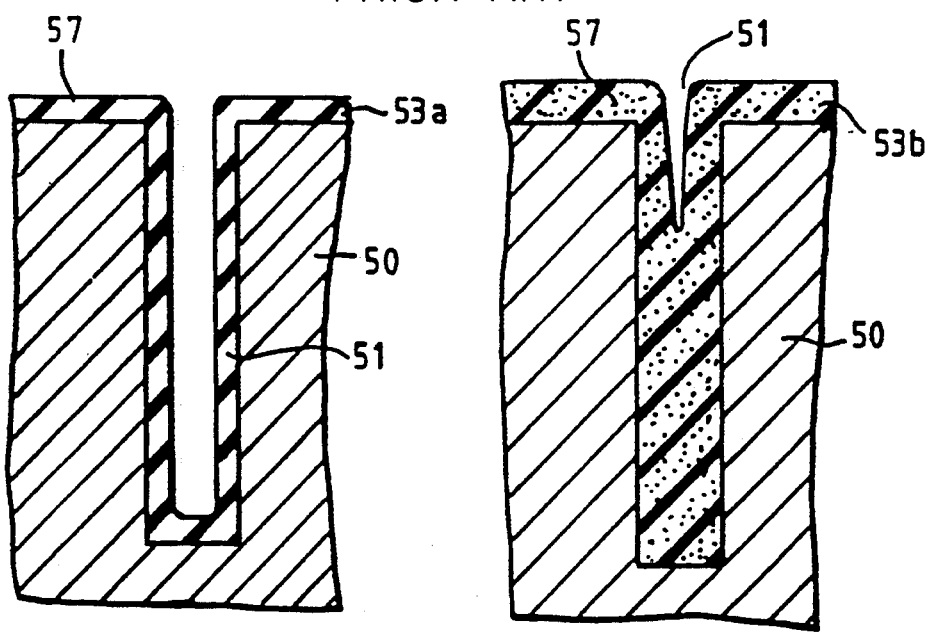
FIG. 23a
PRIOR ART
FIG. 23b
PRIOR ART

METHOD FOR FORMING A FILM ON A SUBSTRATE BY ACTIVATING A REACTIVE GAS

This application is a continuation of application Ser. No. 07/917,531, filed Jul. 20, 1992, now abandoned, which is a division of application Ser. No. 07/686,283, filed Apr. 16, 1991, now U.S. Pat. No. 5,156,881, which is a continuation of application Ser. No. 07/169,577, filed Mar. 17, 1988, now abandoned.

BACKGROUND OF THE INVENTION

1. Field of the Invention

This invention relates generally to a thin film forming method and a thin film forming apparatus, and more particularly to a method and apparatus for forming a thin film on a surface of a substrate having a trench or an unevenness thereon, e.g., a semiconductor substrate.

2. Description of the Prior Art

The processes usually used to form a thin film on a surface of a substrate, such as a semiconductor, are classified broadly into Chemical Vapor Deposition (CVD) and Physical Vapor Deposition (PVD).

The CVD process induces a chemical reaction on the substrate surface or in gaseous phase to form a thin film on the substrate, and this process is used to form insulation films such as a silicon oxide film or a silicon nitride film. The PVD process forms a thin film utilizing collision, against a substrate of depositing materials generated in the gaseous phase, and this process is mainly used for metal film forming.

To achieve satisfactory results, VLSI device fabrication presently requires that a thin film be deposited within a trench formed in the substrate having an aspect ratio one or more (depth/width).

FIG. 22 is a sectional diagram to showing a typical conventional plasma CVD process of the prior art (for example, J. L. Vossen & W. Kern, Thin Film Processes: Academic Press, 1978). In this process, an insulating film 53 is formed by depositing the deposit materials 52, which is in the solid phase generated in gaseous phase within a trench 51 of high aspect ratio formed on a substrate such as silicon. However, the deposit material is deposited heavily on a edge 54 of the trench 51, thereby obstructing other deposit material from entering toward a bottom 55 of the trench 51. Thus, a cavity 56 is formed within the trench 51 and there is a degradation of stage coating properties on the substrate surface.

To cope with the above problem, a process called bias sputtering process, which is one of the PVD processes, is employed (for example, T. Mogami, M. Morimoto & H. Okabayashi: Extended Abstracts 16th Conf. Solid State Devices a Materials, Kobe, 1984, p. 43). This method is to form an insulating film, such as a silicon oxide film, by physically sputtering the substrate surface with ions of argon, for example. In the application of this method, the sputtering makes it difficult to have much deposition on edges, as shown in FIG. 22, and promotes heavier deposition on the flat surface portions. Therefore, the problems of forming the cavity 56 and of the stage coating properties are reduced in comparison to the CVD process above.

However, as the deposit material in gaseous phase comes into the trench on a slant, it is difficult to achieve a good filling within the trench with an aspect ratio of one or more. This method actually has a low deposition velocity, which means a very low productivity, because of the competing reactions between the removal of the deposited film and the film deposition by physical sputtering. In addition, radiation damage is inevitable because the process is conducted in the plasma.

Recently, an ECR bias sputtering method (for example, H. Oikawa; SEMI TECHNOLOGY SYM, 1986, E3-1) was proposed to reduce the oblique incident element of the deposit material within the trench. This method lessens the above-mentioned problem of the oblique incidence of the deposition material within the trench even though the deposit material is in the solid state, but it is not a complete solution. Appropriate forming of a thin film with a trench of the high aspect ratio is still difficult.

Other than the processes described above, a method to form a silicon oxide film using thermal decomposition method a TEOS (R. D. Rung, T. Momose & Nagakubo; IEDM. Tech. Dig. 1982, p. 237) has been proposed. This method, as shown in FIG. 23 (a), has a large surface movement rate of the deposit material, which makes cavity forming difficult, and realizes good stage coating properties. However, when an oxide film 57 having trenches formed by this method is cleaned, for example with diluted HF solution, the removal velocity of the oxide film 57 at the center of the trench 51 is extremely high, as shown in FIG. 23 (b), and as a result, flat filling actually cannot be achieved. The reason seems to be the fact that the distortion of the oxide film grown from both sides of the trench remains around the center. It is thus considered extremely difficult to fill a trench with a high aspect ratio, even when a conformable thin film forming method is employed.

In FIG. 23 (a), after formation of an oxide film with impurity as a solid phase diffusing source using the thermal CVD method etc., a thermal process may be applied to diffuse the impurity around the trench of the substrate. However, when comparing an oxide film formed on the side wall of the trench and that on a flat surface, the former has less impurity density, and a desired resistivity cannot be obtained with this method.

SUMMARY OF THE INVENTION

It is an object of the invention to provide an improved thin film forming process and a forming apparatus for this process which enables a good filling within a trench of high aspect ratio with films of an insulating material, a semiconductor material, and a metal, etc.

This invention solves the problems of the prior art in thin film forming with a trench having a high aspect ratio formed on above-mentioned substrate, such as semiconductors etc., such as cavity forming in the trench, degraded stage coating properties on the substrate surface, or radiation damage against the substrate.

BRIEF DESCRIPTION OF DRAWINGS

A more complete appreciation of the invention and many of the attendant advantages thereof will be readily obtained as the same becomes better understood by reference to the following detailed description when considered in connection with the accompanying drawings, wherein:

FIGS. 2, 3 and 4 are partial sectional views illustrating forming apparatus in accordance with several embodiments of the invention;

FIGS. 16 and 17 are partial sectional views illustrating forming apparatus in accordance with other embodiments of the invention;

FIG. 22 is a sectional view illustrating a conventional method;

FIGS. 23 (a) and 23 (b) are sectional views illustrating steps in accordance with an another conventional method.

DESCRIPTION OF THE PREFERRED EMBODIMENTS

This invention provides a thin film forming method together with a device for that method, which cools the substrate not more than the liquefication point of the deposit species, so that the deposit species in the gaseous phase can exist on the substrate surface under more stable conditions than those when the deposit species are flowing in the gaseous phase.

Figure 1A:
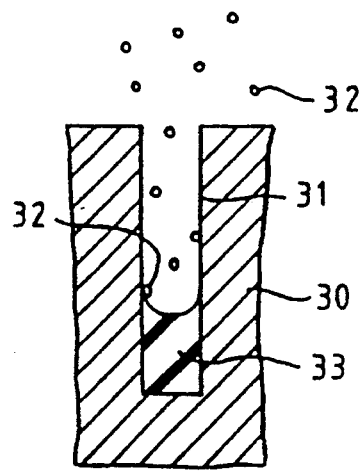
FIGS. 1 (a), 1 (b) and 1 (c) are sectional views illustrating steps of a method in accordance with the invention.
Figure 1B:
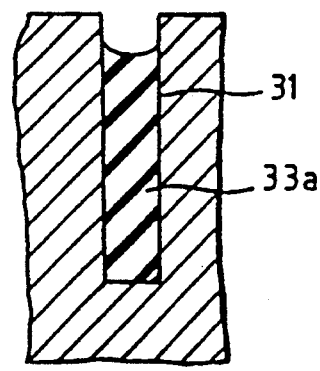
Figure 1C:
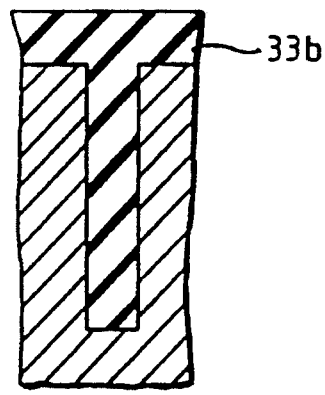

Referring to FIG. 1, the function of the thin film forming method of this invention is explained below.

In FIG. 1 (a), deposit species 32 in a gaseous phase state is deposited within a trench 31 with high aspect ratio formed on a substrate. 30, such as a semiconductor. The substrate is cooled to a temperature of not more than the liquefication temperature point of the deposit species 32, so the species 32 liquefies and adheres on the substrate surface. The reference number 33 represents a thin film formed within the trench 31 by the deposit species 32.

By repeating this process, as shown in FIG. 1 (b), thin films 33a are built up within a trench 31 to form a filling. If the process is continued after the complete filling up of the trench 31, thin film 33b is formed appropriately over the trench 31 and on the surface of the substrate 30.

Figure 24:
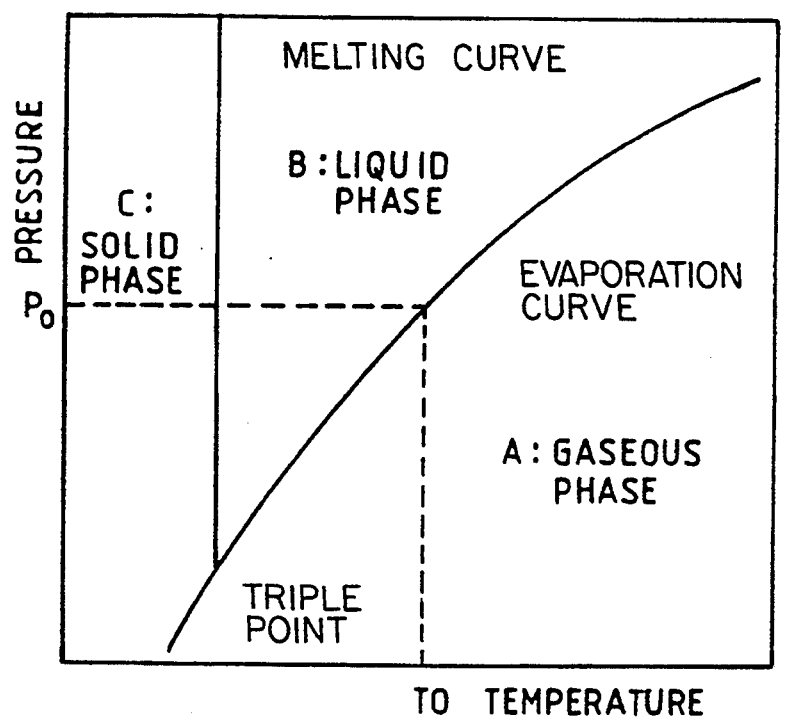
FIG. 24 is a typical state diagram.

To explain this phenomenon, FIG. 24 shows, with parameters of the temperature and the pressure, three phases (gaseous phase, liquid phase and solid phase) of an active species of a first reactive gas, a second reactive gas, or their reaction product. As the temperature of the material including the reactive gas, etc., described above, decreases, the state changes from the gaseous phase A to the liquid phase B. In a high pressure condition, transfer from gaseous phase A to liquid phase B becomes distinctive.

For example, if a reactive gas with pressure $P_0$ is in the state of gaseous phase A, when the temperature is lowered to $t_0$ (the boundary between the gaseous phase and the liquid phase, i.e., the liquefication point) or below, the state changes to the liquid phase.

If the temperature drops more, the state goes to the solid phase. Therefore, this invention utilizes the temperature dependency of three phases above for the trench filling in semiconductor fabrication. When only one kind of gas is used, the substrate temperature shall be set not more than the liquefaction point of that gas.

As described above, this invention provides an excellent flatness after the appropriate filling or plugging of trenches with a high aspect ratio at a low temperature, and is an optimum for VLSI fabrication.

A first embodiment of the thin film forming process according to this invention is described below.

Figure 2:
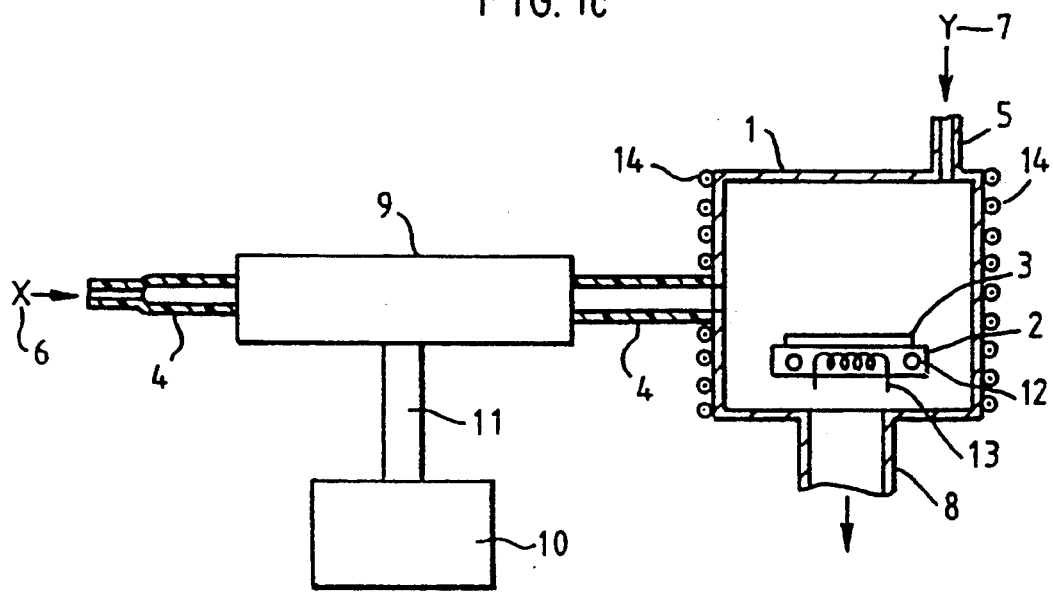

Firstly, an apparatus for this process is explained. FIG. 2 is a schematic configuration illustrating the apparatus according to one of the embodiments of this invention to be used for this process. The configuration of this apparatus is given below.

In a reaction vessel 1 is accommodated a substrate 3 located on a sample holder 2. To the reaction vessel 1, active species of a first reactive gas 6 and a second reactive gas 7 are introduced through the gas introducing pipes 4 and 5, and are exhausted through the exhaust pipe 8 connected to the exhausting system. The flow rate of the first and the second reactive gases can be adjusted with a mass-flow controller (not shown). The first reactive gas 6 is activated in a microwave discharge portion 9 connected to the above mentioned gas introducing pipe 4. The gas introducing pipe 4 is made of a quartz in this embodiment.

Microwave power is supplied from a microwave power source 10 through a waveguide 11 to the discharge portion 9. Activation of reactive gas 6 is performed with the plasma in this embodiment, but it may be done with thermal excitation, optical excitation or electron beam excitation. Pressure in the vessel 1 is set by changing the conductance of a valve (not shown), and is measured with a diaphragm vacuum gauge (not shown) to be controlled.

Within the above mentioned holder 2, a cooling means 12 is provided to cool the substrate 3, and an additional heating means 13 can be provided, if required. These means are connected to a control system (not shown) to monitor the temperature of the substrate 3 and keep it at a fixed value not more than the liquefaction point of the active species generated from the first reactive gas, the second reactive gas and their reaction products.

The cooling means 12 carries nitrogen gas coming through as liquid nitrogen to the holder 2 via a cooling pipe (not shown). The cooling means is controlled by adjusting the flow rate of the nitrogen gas with a needle valve (not shown) provided in the cooling pipe. A heater is used for the heating means 13, but the cooling and the heating means are not limited to those described above, and anything that can keep a constant temperature is acceptable. The substrate is fixed to the above mentioned sample holder so that the substrate can make good thermal contact with the sample holder.

Areas of the substrate other than the reaction vessel 1 and the sample holder 2 may have a structure, for example, with an electric current heater wound around the wall of the vessel 1, to maintain the space in the reaction vessel 1.

As a thin film forming apparatus relating to this invention, other embodiments shown in FIG. 3 and 4 may be utilized. The apparatus shown in FIG. 3 is almost the same as the configuration of the apparatus of FIG. 1, and the same parts are shown with the same reference numbers. The difference of this apparatus from the one in FIG. 2 is that a light radiation means 16 to radiate a beam 15, e.g., electron, ion or laser beams, is provided. This light radiation means 16 enables excitation of the reactive gas with a light. By using this light excitation, as with the apparatus shown in FIG. 2, the damage to the substrate 2 and other adverse influences may be reduced.

Although it is not shown in the figures, the substrate 3 extends into and out of the reaction vessel 1 through another adjacent chamber. This chamber may be evacuated, may contain an inert gas with atmospheric or higher pressure. By this "load-locking" of the reaction vessel 1, reproducibility of the process may be remarkably improved.

The thin film forming apparatus shown in FIG. 4 also has almost the same configuration as the one shown in FIG. 2, and the same parts as in FIG. 2 are indicated with the same reference numbers. These reference numbers show a thin film forming apparatus capable of post treatment after the thin film is formed. In this apparatus, after the thin film is formed on the substrate 3, the substrate 3 is carried through a carrying system 17 to a thermal treatment chamber 18 by a carrying mechanism (not shown). The substrate 3 carried to the thermal treatment chamber 18 is placed on a holder 20 equipped with a heating means 19, and a thermal treatment is applied to the substrate. This heating may be conducted by raising the substrate temperature instantaneously with radiation from an infrared lamp 21.

By conducting the thermal treatment above, residue, dust, etc., on the surface of the substrate 3 can be removed, and the film quality of the thin film can be improved.

In the same figure, a reference number 22 indicates a gas inlet port for introducing an inert gas Z 23, and the reference number 24 is a gate valve dividing the reaction vessel 1 and the thermal treatment chamber 18.

An embodiment of thin film forming process according to this invention is described below. This explanation refers specifically to the apparatus shown in FIG. 2, but any of the apparatuses described above can be used for this process.

In this embodiment, oxygen ($O_2$) is used as a first reactive gas, and tetramethylsilane ($Si(CH_3)_4$; TMS) as a second reactive gas. Using a silicon substrate as a substrate, a silicon oxide film is deposited on this silicon substrate. First, oxygen gas 6, which is the first reactive gas, is introduced through the gas introducing pipe 4 and microwaves of 2.45 GHz are discharged to produce an oxygen radical (O*). Then, this oxygen radical is moved to the reaction vessel 1. Meanwhile, TMS is introduced to the reaction vessel 1 without discharging. The total pressure in the reaction vessel 1 is fixed at 2 Torr. The sample holder 2 has a built-in stainless steel pipe 12. Cooling nitrogen ($N_2$) gas passes through the liquid nitrogen and flows through the pipe 12 to lower the temperature of the substrate 3.

Figure 5:
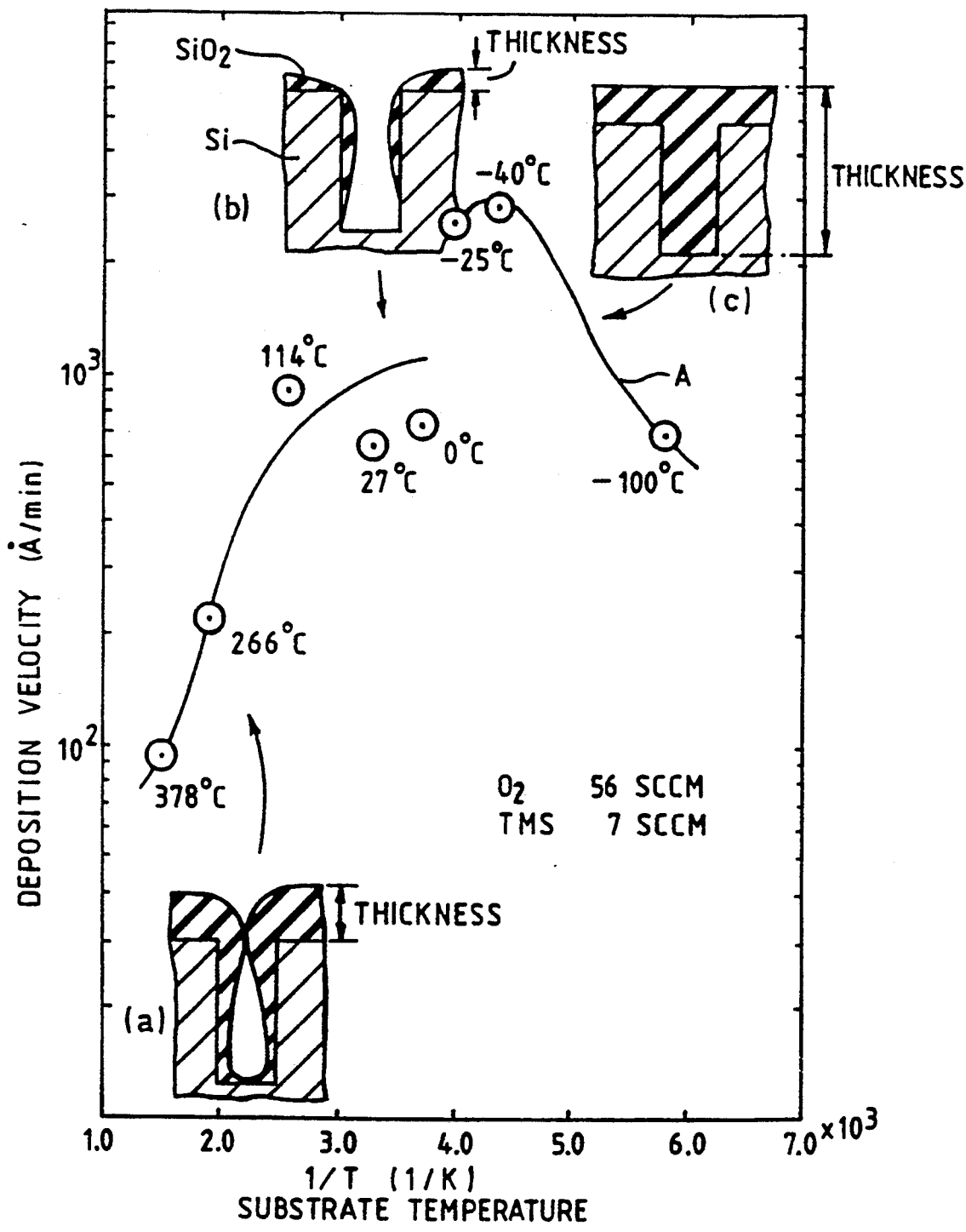
FIGS. 5 and 6 are graphs illustrating functions in accordance with embodiments of the invention.

FIG. 5 shows the deposition velocity of the silicon oxide film at variable substrate temperatures in the above process, and the resulting configuration of a trench on the substrate. The flow rates of oxygen and TMS are 56 SCCM and 7 SCCM, respectively, and the trench has an aspect ratio of 1.5.

It is seen from this graph that the deposition velocity represented by the curve A reaches the highest point when the substrate temperature is $-40°$ C. For the filled trench configuration, at a temperature above room temperature, the silicon oxide film formed by the reaction of the O* radical and TMS forms a cavity as described in the prior art.

On the other hand, with the decrease of the substrate temperature, the intensive deposition on the trench corners decreases and at the substrate temperature of $-20°$ C. or less, the thin film can fully fill the trench.

Figure 6:
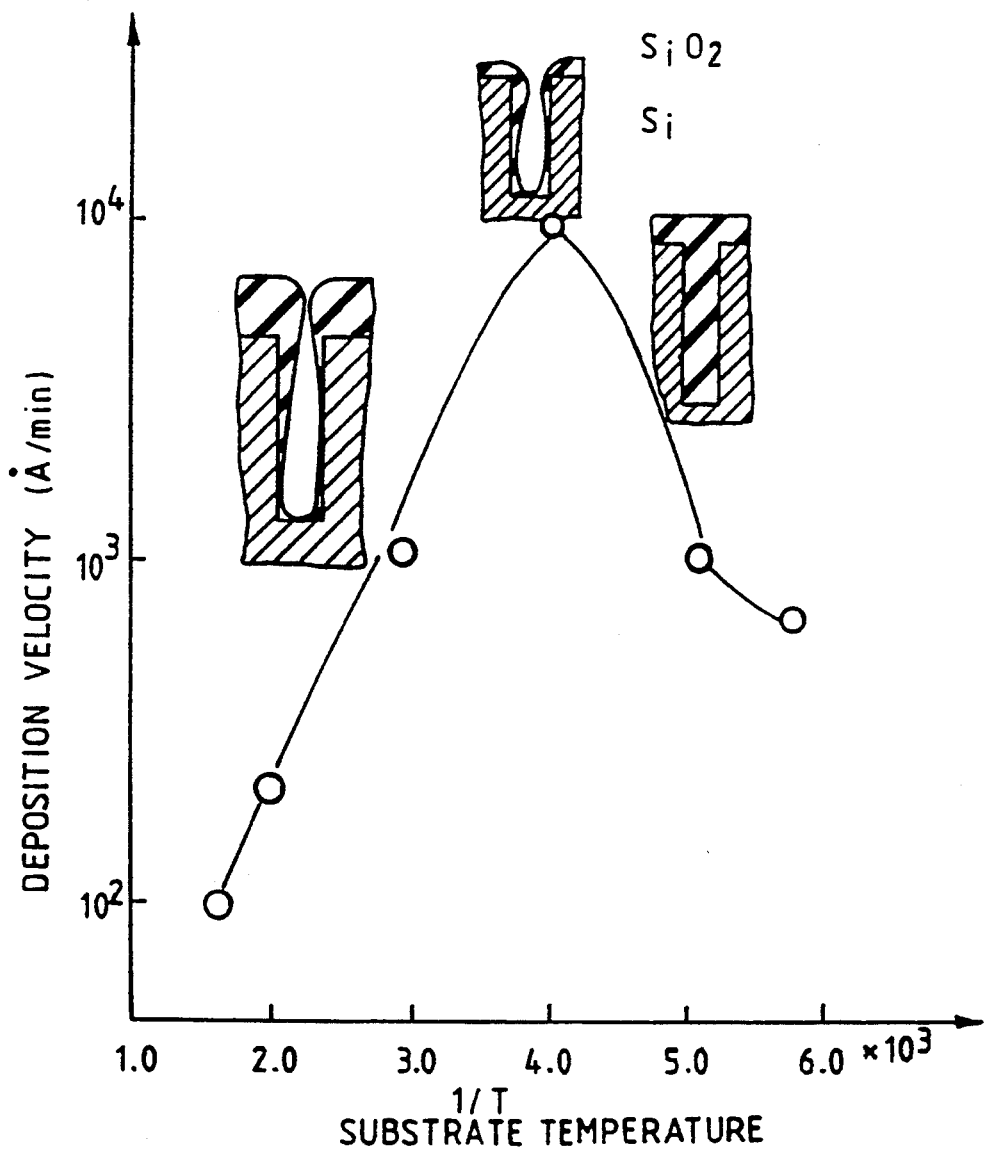

FIG. 6 shows the deposition velocity and the deposition configuration at the different substrate temperatures when the flow ratio of oxygen to TMS is 24. Conditions other than the flow ratio are the same as in FIG. 5. FIG. 6 shows a tendency similar to that seen in FIG. 5. It is observed that this process is optimum for the formation of an interlaminar insulation film in the multilayer wiring technique.

The inventors of this invention have made a further study to find optimum conditions for forming a thin film within a trench. Details are described below.

Figure 7:
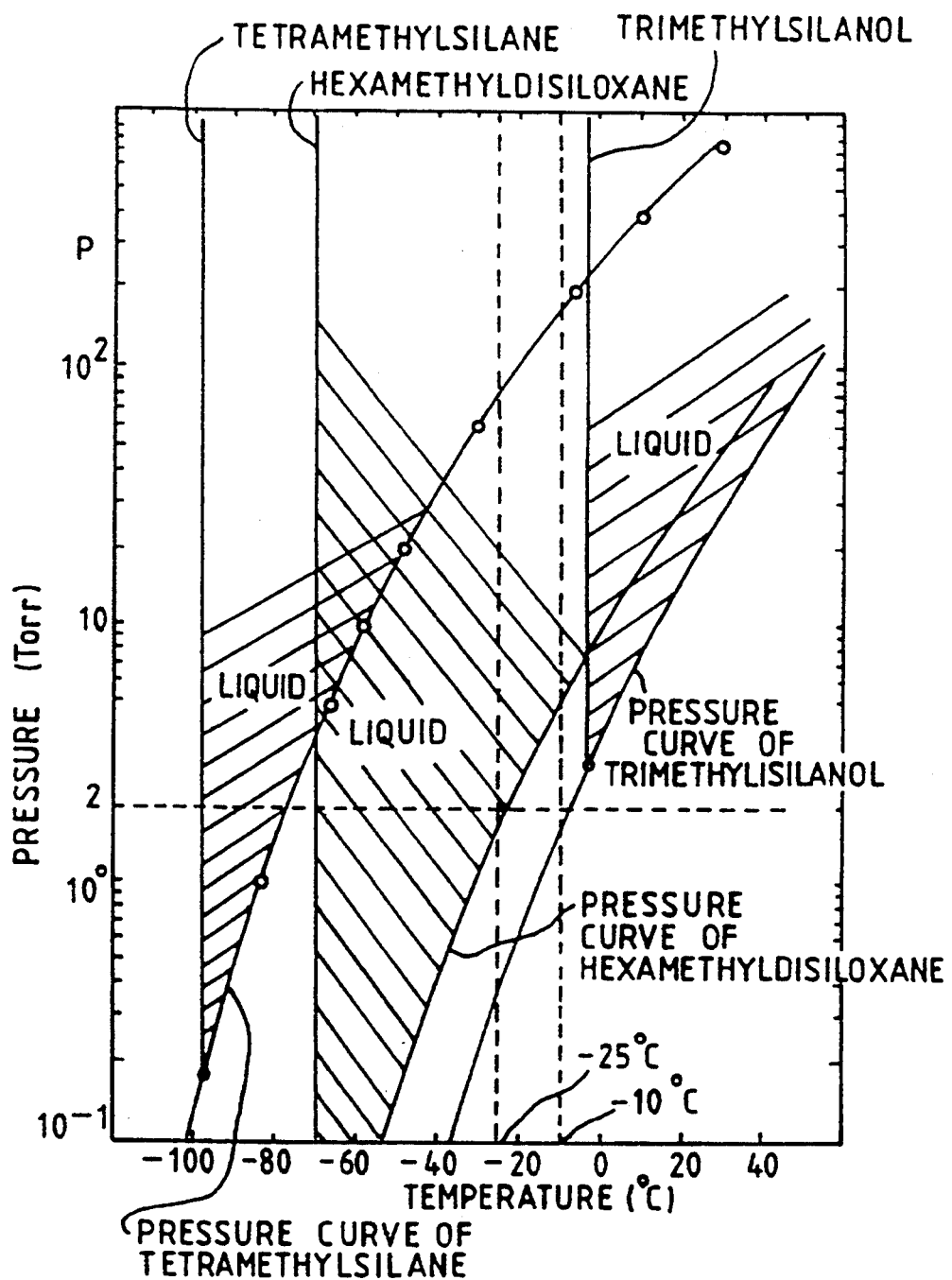
FIG. 7 is a state diagram illustrating relationships of pressure and temperature in accordance with the embodiment of the invention.

FIG. 7 is a phase diagram of hexamethyldisiloxane and trimethylsilanol which can be reaction products by tetramethylsilane (TMS)-oxygen ($O_2$) active species and tetramethylsilane. As described in the embodiment above, when the interior pressure of the reaction vessel is 2 Torr, the trench interior can be filled if the substrate temperature is lowered to about $-20°$ C. It is assumed from this phase diagram that the liquid used in the deposition includes tetramethylsilane and/or hexamethyldisiloxane at a substrate temperature in the range of $20°$ C. to $-100°$ C. and a vessel internal pressure of less than 10 Torr. It is also considered that oxidation proceeds while entrapping active oxide species in the liquid layer. This assumption may be reasonable since the infrared absorption spectra of this film is nearly identical to that of the plasma polymerization film of hexamethyldisiloxane.

Thus, when the internal pressure of the reaction vessel is 2 Torr, the substrate temperature is required to be not more than $-22°$ C. where hexamethyldisiloxane is liquid and not less than $-100°$ C. where tetramethylsilane is a solid.

Consequently, it is necessary to arrange an appropriate thermal contact between the substrate and the sample holder, a uniform distribution of sample temperature, and a correctly measured and controlled temperature to make the liquefication possible.

Figure 8:
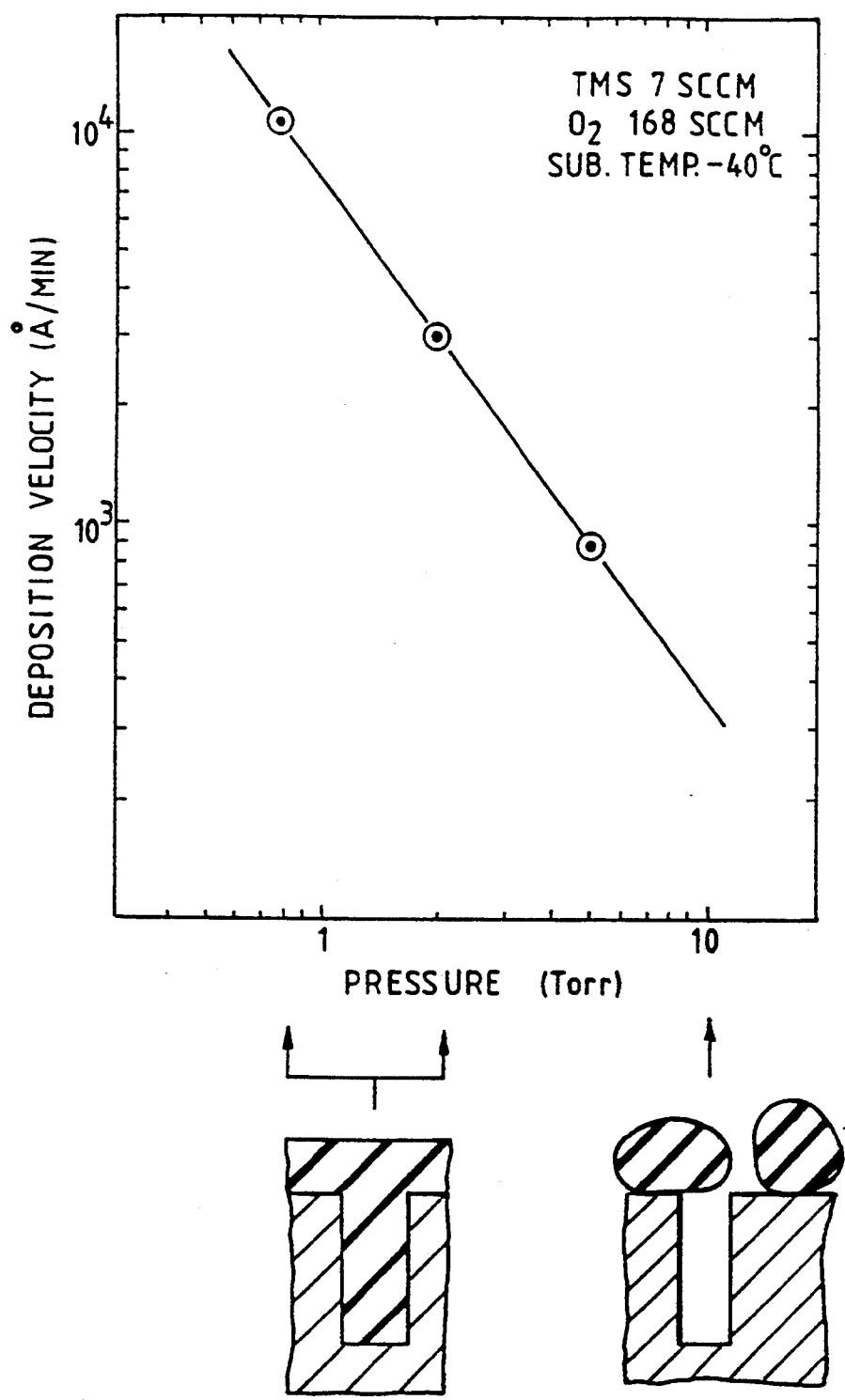
FIG. 8 is a graph illustrating the relationship of the deposition velocity and the pressure in accordance with the embodiments of the invention.

FIG. 8 is a diagram showing the deposition velocity and the deposition configuration with changes of internal pressure of the reaction vessel. The substrate temperature is set at $-40°$ C., and the flow rate of TMS and oxygen at 7 SCCM and 168 SCCM respectively. As a result, the deposition forms a large lump on the substrate surface around 10 Torr, and the trench cannot be filled. As the pressure decreases, however, filling becomes possible and the deposition velocity increases.

Figure 9:
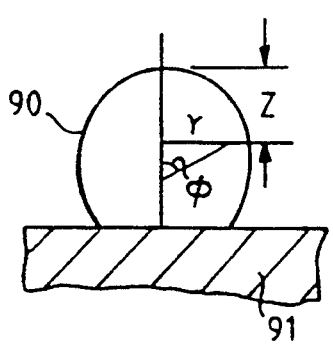
FIGS. 9, 10 (a) and 10 (b) are sectional views illustrating the functions in accordance with the embodiment of the invention.

The shape of a globule 90 adhered on the substrate surface as a lump can be expressed by the formula below in the coordinates shown in FIG. 9, using a Laplace equation:

$$\gamma (1/R + \sin\phi/r) = \rho g z + \Delta P_0$$

where, the reference number 91 indicates the substrate; the main curvature of the curved surface in the plane of the figure is r/sin$\phi$, and the main curvature perpendicular to this is R, $\gamma$ represents the surface tension, $\rho$ is the liquid density and $\Delta P_0$ is the pressure difference between the inside and the outside of the globule 90. If the globule 90 is rotationally symmetrical and the two main curvatures at the apexes are equal to b, according to the equation above, $$\gamma \cdot 2b = \Delta P_0$$

Figure 10A:
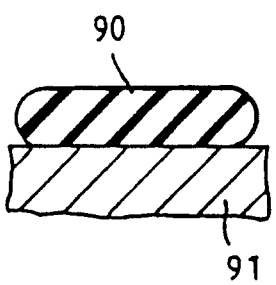
Figure 10B:
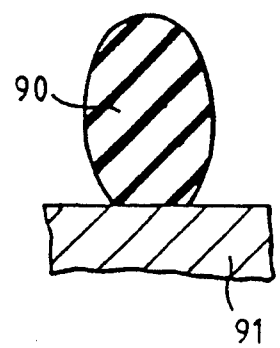

This means that when the pressure difference $\Delta P_0$ is larger with an equal surface tension $\gamma$, the radius of curvature b of the apexes becomes smaller, and results in a long shaped globule as shown in FIGS. 10a and 10b. As the pressure of the microwave discharge changes, the types and the quantity of the oxygen active species may change, the functional group produced on the silicon substrate surface may change, and the contact angle to the hexamethyldisiloxane or tetramethylsilane may change.

For these reasons, even in the pressure and temperature range of liquefication, it is suitable to set the pressure at the contact angle in the range where liquid flows into the inside of the trench, and it is preferable to have a pressure of 10 Torr or less for to process of this embodiment.

The appropriate pressure should not be less than the temperature of the triple point of hexamethyldisiloxane or tetramethylsilane, so that they will be liquefied.

Figure 11:
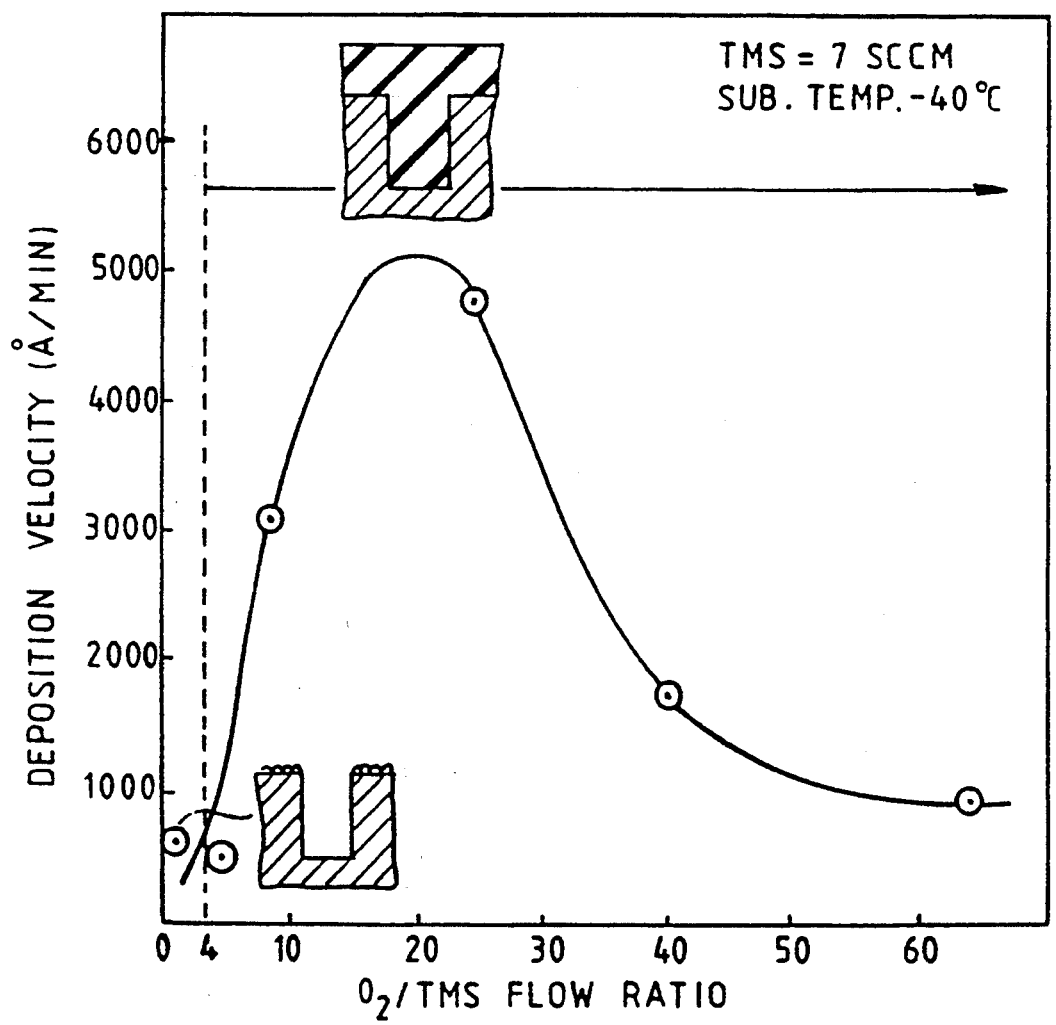
FIGS. 11, 12, 13, 14 and 15 are graphs illustrating different relationships of parameters in accordance with the embodiment of the invention.

FIG. 11 shows the deposition velocity and deposition configuration change to the flow ratio of oxygen and tetramethylsilane. From this figure, it is seen that the deposition velocity reaches its peak when the oxygen/TMS flow ratio is around 20. The trench can be filled with an approximate oxygen/TMS flow ratio of 4, and the trenches can be filled at ratios not less than this value. The reason for this phenomenon is considered to be the fact that, in the formation of hexamethyldisiloxane from oxygen and TMS, the following reaction occurs.

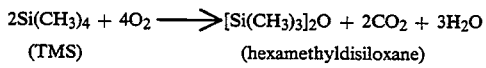

$$2Si(CH_3)_4 + 4O_2 \longrightarrow [Si(CH_3)_3]_2O + 2CO_2 + 3H_2O$$
(TMS)　　　　　　　　(hexamethyldisiloxane)

where, oxygen/TMS equals 2. Therefore, when tetramethylsilane is 7 SCCM, the oxygen is required to be 14 SCCM or more, and the flow ratio is preferably at least 2 or more for an ideal reaction.

Figure 12:
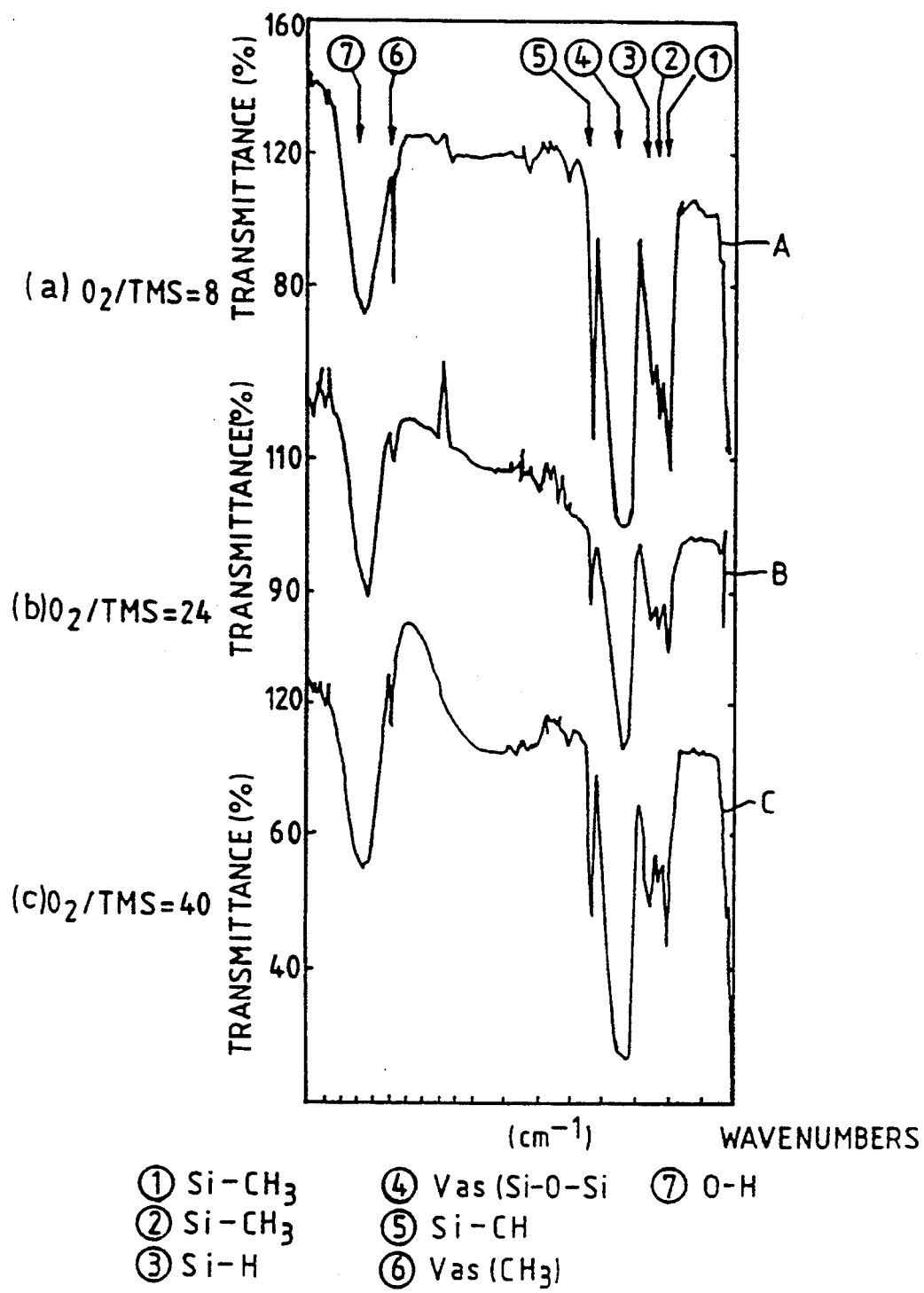

FIG. 12 shows infrared absorption spectra of a deposited film for oxygen/TMS flow ratios of 8 (graph A), 24 (graph B) and 40 (graph C). An absorption peak of Si—O—Si is observed in the range from 1200 $cm^{-1}$ to 1000 $cm^{-1}$, and the film is confirmed to be a silicon oxide film.

Figure 13:
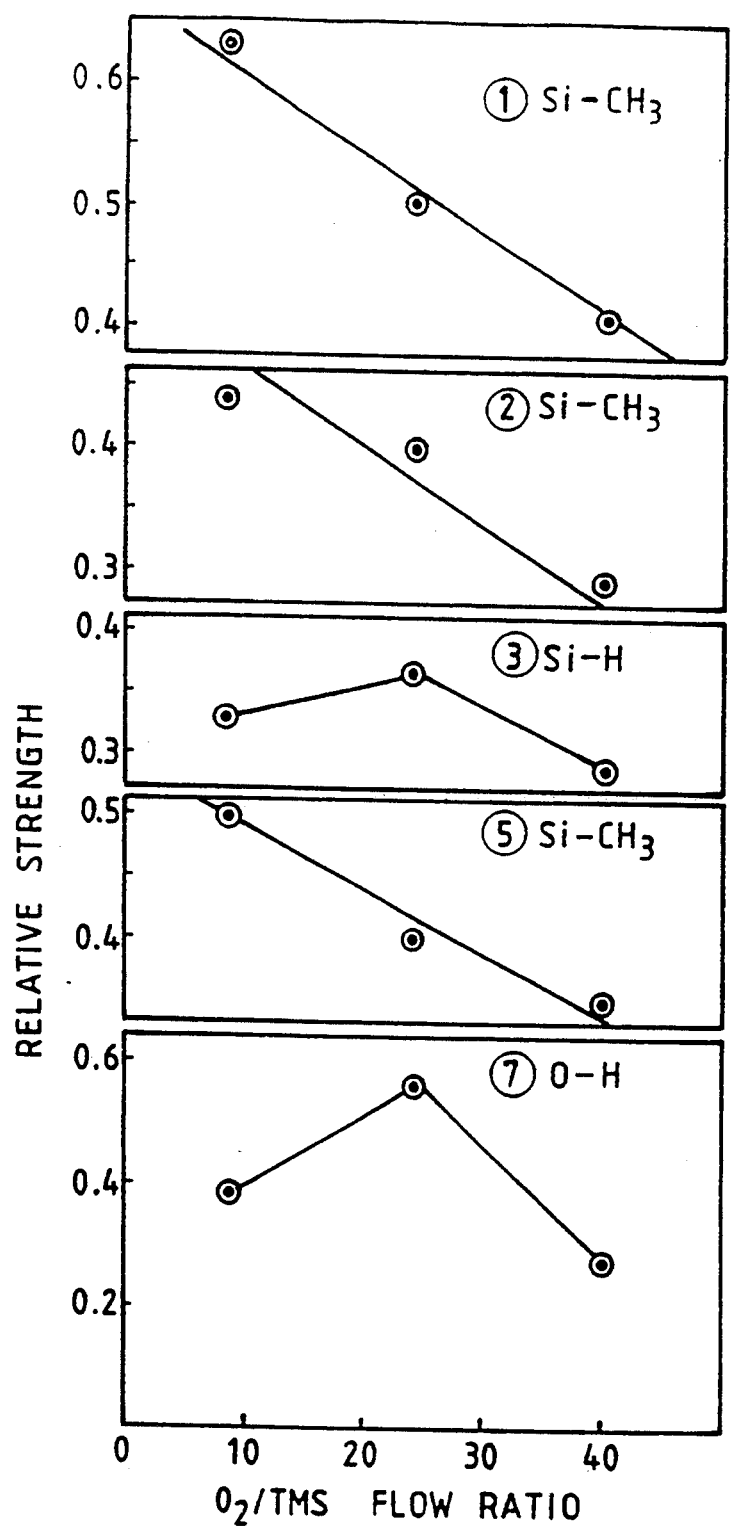

Strength changes of the absorption peaks of Si—$CH_3$, Si—H, O—H specified by this Si—O—Si absorption peak to oxygen/TMS flow ratio are shown in FIG. 13. From this figure, it is seen that the larger the oxygen/TMS becomes, the more the silicon oxides. Reference numbers in circles 1 through 7 correspond to the references in FIG. 12.

Figure 14:
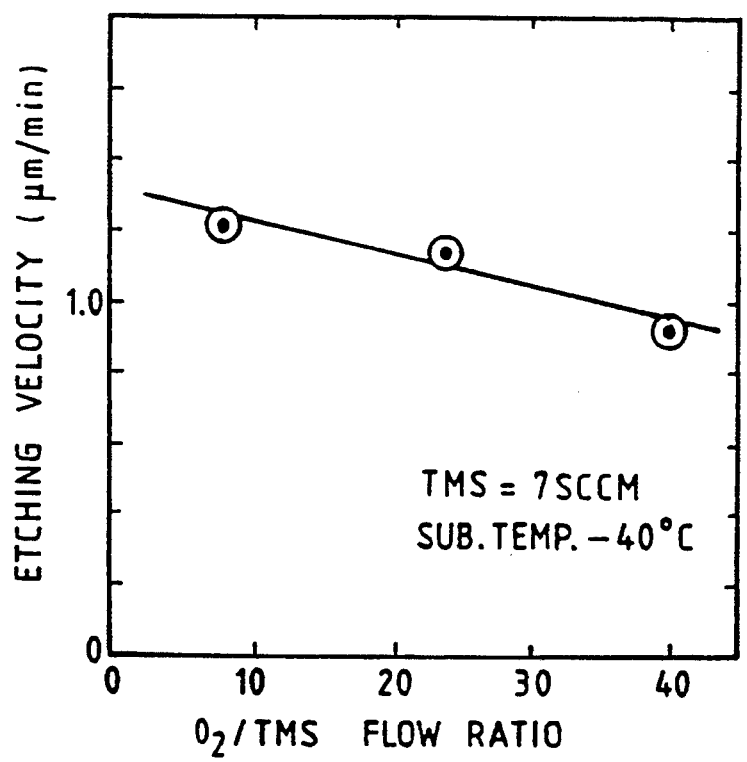

Next, a study of the characteristics of the thin film formed with the present invention is described below. As shown in FIG. 14, the oxygen/TMS flow ratios at varying velocities of etching on the deposited film are determined using a solution including 6% of HF and 30% of $NH_3F$. These determined values show that, as oxygen/TMS increases, the etching velocity decreases and the film is further nitrogenized. Thus, it is found preferable to increase the oxygen flow rate and make the oxygen/TMS flow ratio larger for a good quality film deposit.

After the thin film deposition on the substrate, the substrate is thermally treated in the reaction vessel with the two methods below.

(1) Maintain the substrate temperature at 300° C. in oxygen of 10 Torr for 1 hour.

(2) While discharging microwaves into the oxygen of 2 Torr, maintain the substrate temperature at 300° C. for 1 hour.

Figure 15A:
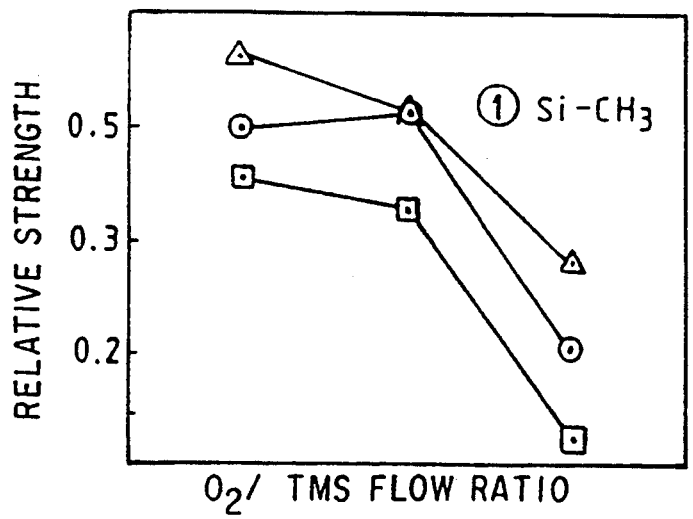
Figure 15B:
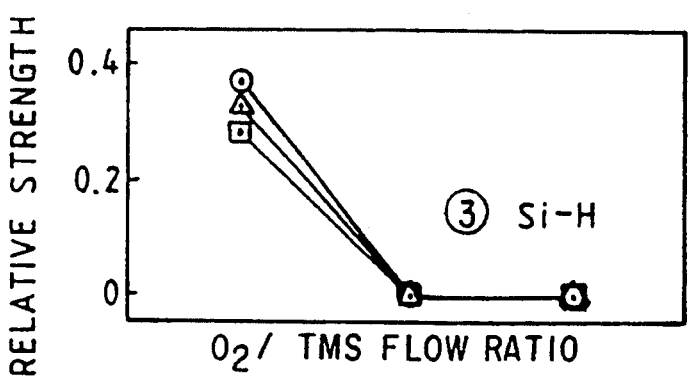
Figure 15C:
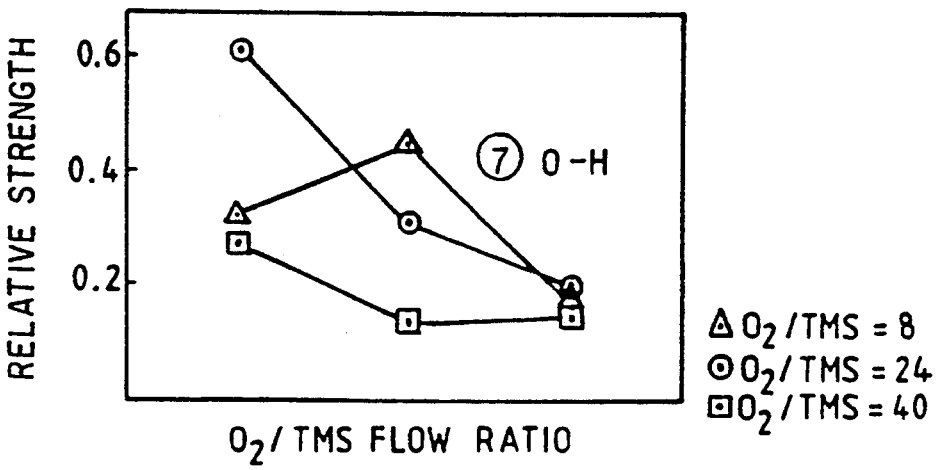

The absorption strength changes of Si—$CH_3$, Si—H and O—H specified with the Si—O—Si peak absorption of the infrared absorption spectra for the film obtained from the above versus oxygen/TMS flow ratio is shown in FIG. 15. The combination of Si—$CH_3$ and O—H decreases first during the thermal treatment of (1), and second during the thermal treatment in (2), and the silicon oxidization proceeds. It was found that the combination of Si—H disappears during the treatment processes of (1) and (2). In conclusion, to improve the film quality of the deposited film, the substrate temperature should be at least 300° C. The thermal treatment in (1) and (2) above can promote oxidization of silicon, and it has been observed that, in particular, the oxidization caused by the thermal treatment process (2) is remarkable.

Radiation of an ArF excimer laser with a wave length of 193 nm during the film forming activates the liquefied layer or substrate surface, resulting in a further flatness of the filled trench through experiments. Radiation energy of the ArF excimer laser is then 330 Joul/$cm^2$ sec. As the activation proceeds more when the energy is not less than this value, this activation will occur when the energy is 330 Joul/$cm^2$ or higher. This activation is performed by an impact with ions, electrons, etc., on the substrate surface, and this will enhance the surface migration of the active species to the thin film to promote the flatness of the filled trench surface.

The above-mentioned thin film forming apparatuses have separated vessels including one for plasma forming and another for the reaction. The invention may be also applied to the one vessel type thin film forming apparatus.

FIG. 16 is a schematic view showing a thin film forming apparatus according to one embodiment of this invention. In FIG. 16, 101 denotes a grounded vacuum vessel forming the reaction vessel. Prescribed first and second reactive gases are introduced into the reaction vessel 101 through a gas inlet 102. The mixed gas contained in the reaction vessel is exhausted through a gas outlet 103. In the reaction vessel 101, a cathode (first electrode) 105 is disposed opposite the top wall of the vacuum vessel serving as an anode (second electrode).

On the first electrode is placed a substrate 106, and a cooled nitrogen gas is passed over this electrode for cooling. A heating device (not shown) is also provided To raise the temperature. Further, the first electrode is connected to a high frequency power source 109 through a matching circuit 108. A heater 111 is coiled around a wall 110 of the reaction vessel 101, thereby preventing adhesion of the deposition film. Although it is not illustrated, another vacuum vessel which is vacuous or filled with an inert gas is disposed between the above reaction vessel 101 and the atmosphere for loading and unloading the substrate 106.

Thus, the reliability of the process is greatly enhanced by making the reaction vessel a so-called load-lock type. In the same drawing, 116 denotes an insulator. Further, another embodiment is shown in FIG. 17. Parts identical with those shown in FIG. 16 are assigned the same reference numbers.

In this embodiment, a thin film was deposited on a substrate 106 in the same way as in the above embodiment and the substrate 106 was moved to another reaction vessel 112 with a carrier (not shown) and placed on a holder 113 and heated thereon by a heating means (not shown). In addition to the heating from the substrate side, this heating treatment may be effected by raising the substrate temperature instantaneously with an infrared lamp irradiated just above the substrate 106, for example. Further, an inert gas or the first reactive gas may be introduced through a gas inlet 102a during this heating treatment. Also, a high frequency power source 109 is connected via a matching circuit 108, so that the plasma can be generated during the heating treatment.

In the drawing, number 115 denotes a gate valve. This invention may be applied in various ways. For example, a magnetic field may be supplied from outside between parallel plate electrodes applied with the above RF power as a means to generate the plasma, thereby generating a high-density plasma. Also, electrical discharge may be generated by ECR (Electron Cyclotron Resonance) discharge, a hollow cathode discharge, or by supplying high frequency power from outside with the substrate disposed in a vacuum vessel of an insulator, such as a quartz.

Another thin film depositing process according to the present invention using the apparatus shown in FIG. 16 will be described below. Oxygen and a tetramethylsilane $Si(CH_3)_4$ (TMS) as the first and second reactive gases are inserted into the reaction vessel 101.

Figure 18:
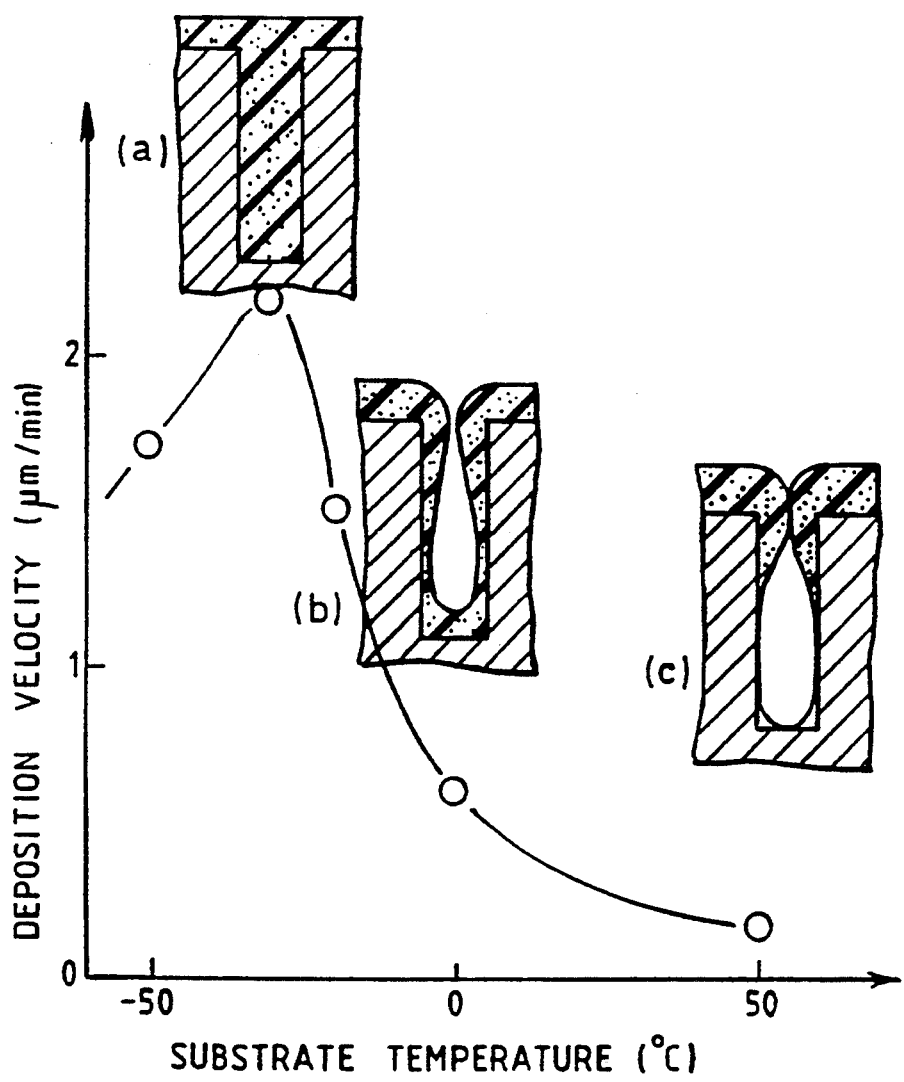
FIG. 18 is a graph illustrating the relationship of the deposition velocity and the substrate temperature in accordance with the invention.

FIG. 18 shows how the silicon oxide film is formed on the silicon substrate. The lateral axis indicates the temperatures of the substrate and the vertical axis shows the deposition velocity. The cross sections show different filled shapes formed within the trench of the substrate. The plasma is generated by applying an RF power of 13.56 MHz between the first and second electrodes to cause a high frequency electrical discharge. In the reaction vessel, oxygen is introduced at a rate of 40 cc/minute and TMS of 5 cc/minute. The total pressure is $5 \times 10^{-3}$ Torr.

A magnet is disposed on the second electrode side to allow high-density plasma to be obtained. It is seen from FIG. 18 that the deposition velocity exhibits a maximum value with respect to changes of the substrate temperature. It is seen by observing the filled shape within the trench, that when the aspect ratio of the trench is one or more, $SiO_2$ produced by the reaction of the oxygen radical and TMS in the gaseous phase at a temperature above room temperature as shown in FIG. 18 (c) is deposited on the substrate similar to falling snow, as seen in the so-called conventional plasma CVD process, and the cavity is formed.

On the other hand, it is seen that with a decrease of the substrate temperature, the deposit which is predominantly formed on the corner of the trench is reduced and when the substrate temperature is $-20°$ C. or less the trench can be completely filled. This phenomenon is believed to take place in the following manner. The reaction products of the oxygen radical and TMS, such as hexamethylsiloxane $(Si(CH_3)_2)_2O$ and trimethyldisiloxane $Si(CH_3)_3OH$, liquefy at the temperatures as shown in FIG. 18 and liquid is formed as a layer on the substrate surface. This liquid layer catches therein $SiO_2$ species which have further reacted in the gaseous phase.

Figure 19:
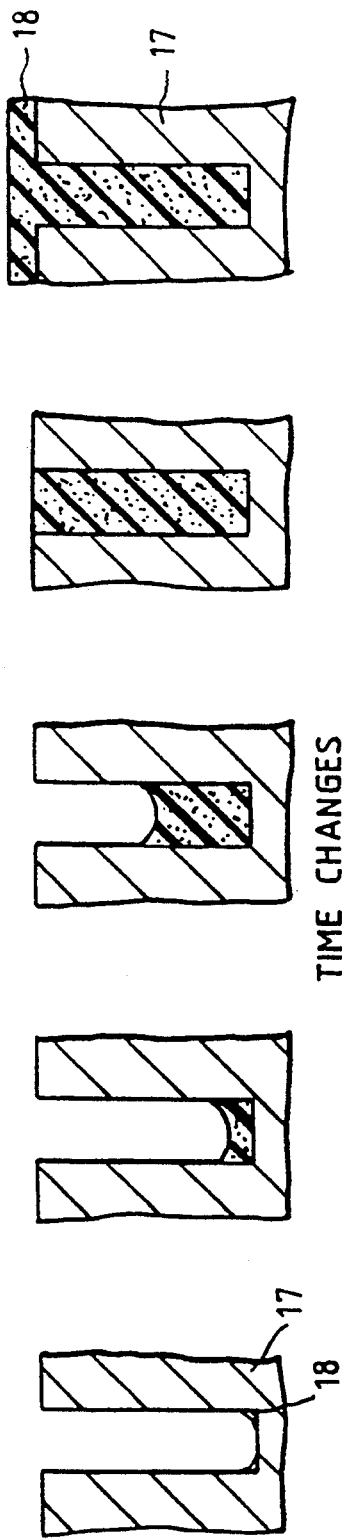
FIGS. 19, 20 (a) and 20 (b) are sectional views illustrating the steps of a method in accordance with the another embodiment of the invention.

It is believed that the oxidation proceeds accompanying the inclusion of the oxygen radical and the tacking in of the oxygen ions. On the other hand, the above liquid layer is finely dispersed over the substrate surface and therefore it exists most stably on the bottom corner of the trench to provide a large contact area in the substrate surface. As a result, observation of deposition over time indicates that the deposit is first formed on the corner. Therefore, as shown in FIG. 19, the deposit accumulates from the bottom of the trench upward to form a film, making it possible to fill a trench with a high aspect ratio and to provide a very even surface, which could not be done heretofore.

It is possible also to form a film at a low temperature. This is effective for the formation of an interlaminar insulation film in the multilayered wiring process. Using nitrogen or $NH_4$ instead of oxygen, a silicon nitride film ($Si_3N_4$) can be formed. It is needless to say that by using a material containing at least one element which is included in groups II to VI of the periodic table as the second reactive gas and suitably varying the substrate temperature, oxide and nitride can be formed readily.

It is also needless to mention that the gas pressure in the reaction vessel is not limited to the above-mentioned $10^{-3}$ Torr but can be selected to fall in the most effective pressure range according to the discharging method and the reactive gas used.

Addition of an inert gas such as argon or helium to the first reactive gas prolongs the service life of the deposition species as a metastable active species and provides more effective deposition. The reaction gas to be used may be one type and a desired film may be deposited by a process such as thermal decomposition. It was experimentally confirmed that in the process of forming the film, the irradiation with an excimer laser having a wavelength of 193 nm, or with ions, electrons or the like, enhances the activity of the above liquefied layer, increasing the surface migration of the active species within the layer and completing the filling of the trenches, making the film completely flat.

In the formation of the above silicon oxide film, when impurities such as $POCl_2$, $PCl_3$, $PH_3$, $BCl_3$, $B_2H_6$ and $AsH_4$ are added to TMS, for example, the oxide film produced includes these impurities. This film fills the trench. Then it is heated instantaneously with a heater or a lamp, for example. This disperses the impurities into the silicon substrate. Heretofore, an oxide film containing the impurities along the walls was produced by the thermal CVD process. However, the concentration of the impurities contained in the oxide film which is formed along the side walls of the trench is lower than in the planar portion. Thus, a desired specific resistance could not be attained from the side walls.

Figure 20B:
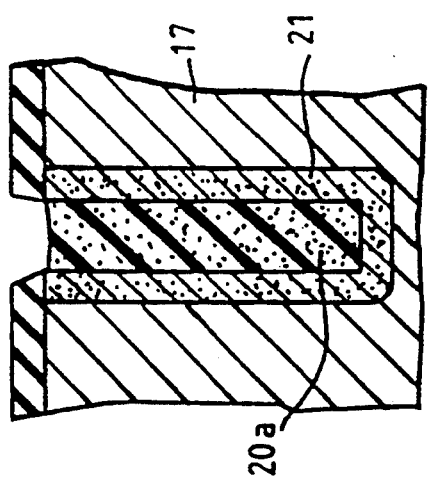
Figure 20A:
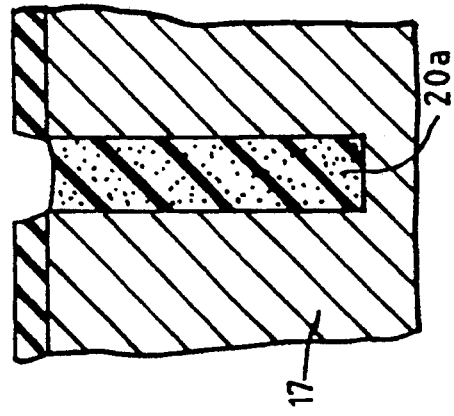

The oxide film according to the present invention includes the impurities in a very uniform amount as shown in FIG. 19 describing the depositing state with the lapse of time. Therefore, after depositing, as shown in FIG. 20, a thermal treatment is given to remedy the above drawbacks completely. The dispersion layer as shown in FIG. 20 is essential to provide a sufficient memory capacity for large scale memory devices, such as 16M and 64M DRAMs. The above thermal treatment, when effected after the film formation, for example in situ within the treating chamber as shown in FIG. 16 or FIG. 17, can completely avoid the contamination by the impurities other than the prescribed impurities, such as carbon, nickel and other heavy metals. Thus, a high quality film is deposited.

The inclusion of gas containing a hydrogen and a halogen element in the reactive gas reduces the methyl group contained in the TMS, and more stable $CH_4$ and $CH_3Cl$ are produced and removed, resulting in the lowering of the concentration of the carbon impurities. Thus, the film quality is much enhanced. $AsH_4$ is used as an impurity to be added to the second reaction gas in this example, but in case of phosphor (P) diffusion, a material such as $POCl_3$, $PCl_3$ and $PH_3$ which reacts with the first or second reactive gas element to produce phosphor, may be used. In case of boron (B) diffusion, $BCl_3$, $B_2H_6$, etc., may be used. For example, it was confirmed that when the organic metal compounds such as $Al(CH_3)_3$, $Ti(C_5)_2$, carbonyl metals, such as $W(CO)_6$ and $Cr(CO)_6$, and halogenated metals are used together with hydrogen and nitrogen, metals can entirely fill in a space with a high aspect ratio, such as a contact hole.

In addition to the above thin film forming, using for examples $GeH_4$, $SiH_4$, $SiCl_4$, $GeCl_4$, and a gas including at least silicon, the deposition of silicon and germanium can be done. Using $As(CH_3)_3$, $AsH_3$, $Ga(CH_3)_3$ and $GaH_3$, GaAs and other group III-V compounds can be deposited and using a reactive gas containing indium and phosphor, InP and other group II-VI compounds can be deposited.

Further, using a reactive gas containing at least carbon and hydrogen, various high molecular organic films can be deposited. For example, when methylmethacrylate (MMA) is introduced and the substrate temperature is lowered to $-30°$ C. or less, PMMA, which is used for an electron beam resist, can be formed.

Proceeding now to the explanation of another embodiment relating to the thin film forming process of this invention, a macromolecule thin film forming process using hydrogen, nitrogen or gases including a halogen element, such as $SiCl_4$, as the first reactive gas, and a gas at least including carbon and hydrogen as the second reactive gas, is described below. This process is basically the same as above-mentioned embodiment, and is briefly described with reference to FIG. 3.

The substrate used here has an unevenly configuraed surface provided with the trench having an aspect ratio of one or more. Nitrogen ($N_2$) gas is used as the first reactive gas, and N* radical is introduced into the reaction vessel by discharging. Methylmethacrylate (MMA) is introduced as the second reactive gas and the exhaustion is conducted.

The substrate temperature is cooled to $-30°$ C. or less. This results in the covering of the unevennness on the surface of the substrate with a film of PMMA, a polymer of MMA, for the same principle as the one illustrated in FIG. 1, to achieve a super flatness. The PMMA film is widely used as an electron beam resist.

Figure 21:
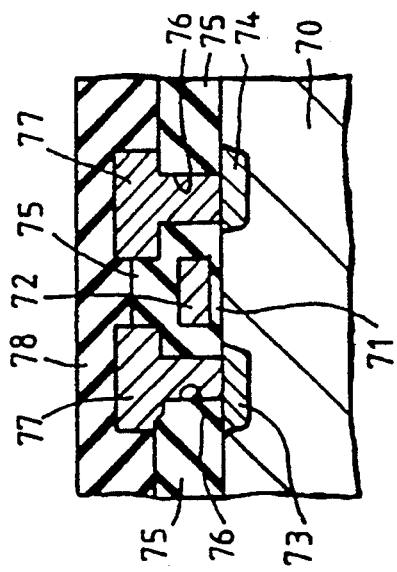
FIG. 21 is a sectional view illustrating a semiconductor device in accordance with another embodiment of the invention.

Another embodiment relating to the thin film forming process of the present invention is explained below. FIG. 21 is the sectional view of the final process showing the formation of the source, a drain electrode and a wiring for a MOS transistor using the process of this embodiment.

A gate oxide film 71 and a gate electrode 72 are formed on a silicon substrate 70, and the source and the drain areas 73, 74 ape integrally formed to the gate.

After the coating of the entire surface with a silicon oxide film 75 using a CVD process, etc., the silicon oxide film 75 on the source and the drain 73, 74 is partially removed by etching to form a contact holes 76 with an aspect ratio of one or more.

A wiring 77 for the source and the drain electrodes is next formed with the method of this invention. In particular hydrogen is used as the first reactive gas and $Al(CH_3)_3$ as the second reactive gas, and the substrate temperature is set at a specified value to fill the alminium electrode wiring 77 completely into the contact hole 76 and form a super flatness by repeated deposition. After patterning of the electrode wiring 77, a silicon oxide film 78 is formed as protective film all over the surface. This protective film 78 can be formed by the process of this invention. By covering the wiring and the trenches formed by the CVD oxide film 75 with a protective film utilizing the same method as shown in the first embodiment, a flat film can be formed.

In this embodiment, the mechanical vibration of the substrate 70 during the forming of the electrode wiring 77 disturbs a trench retaining layer (a stagnant layer) of the gaseous phase to promote the deposition of the alminium film on the substrate 70. Such vibration of the substrate itself, or the gaseous phase during the thin film forming is effective to increase the deposition velocity and to improve the film quality.

As a means to create vibrations, a motor, etc., may be provided at the sample holder 2, as shown in FIGS. 2 through 4, to produce the mechanical vibration, or a supersonic wave oscillator may be incorporated in the holder 2.

Although, aluminum is used for the metal filling the trenches, such as the MOS transistor contacts, etc., in this embodiment, the second reactive gas can be $Ti(C_2H_5)_2$, carbonyl metal, such as $W(CO)_6$ or $Cr(CO)_6$, or halide metal, etc., instead of $Al(CH_3)_3$.

Embodiments of the present invention are explained above and some additional examples are described below. In place of the oxygen discharge in these embodiments, gases at least including an oxide, such as $N_2O$, can be used. By using nitrogen or $NH_3$, formation of a silicon nitride film is possible. When using a gas including at least one element of the second to sixth group in the periodic table, oxide films can produce nitride. The substrate temperature at that time can be set at a value not more than the liquefication points of the active species of the first reactive gas, the second reactive gas and their reaction product, depending on the type of gases.

Mixing inert gases such as argon or helium with the first reactive gas generates long-life metastable active species of these inert gases. These active species can carry the active species of the first reactive gas, and this results in high flexibility of the device design.

Other than the thin film forming above, for example, silicon or germanium deposition is possible using hydrogen as the first reactive gas and using a gas containing at least germanium or silicon such as $GeH_4$, $SiH_4$, $SiCl_4$ and $GeCl_4$ as the second reactive gas. Group III to V compound, such as GaAs can be deposited when the second reactive gas is $As(CH_3)$, $AsH_3$, $Ga(CH)_3$ or $GaH_3$, and group II-VI compounds, such as InP, may be used when some reactive gas includes indium and phosphor.

The thin film forming process explained above using raw material gas of the thin film as the second reactive gas (for example, Al(CH$_3$)$_4$+H$_2$) can produce the same effect.

In FIGS. 2 through 4, the rotating mechanism can be connected to the sample holder 12 for supporting the substrate 3 so that the substrate 3 is rotated at a high velocity and the reactive gas diffuses uniformly. The rotation may be at a fixed velocity, or may be intermittent to avoid a rotation of the gaseous phase with the substrate.

The configuration above can increase the deposition velocity more, and reduce variations in the deposition velocity and the deposition film composition on the substrate. Such variations result from the difference of the distance from the gas inlet port 4 and 5 to the surface of the substrate 3, even in the case of a large-sized substrate, such as a silicon wafer. For radiation by electrons, ions and light, such as a laser beam, this is convenient because it can compensate for beam variations, and a large diameter beam is not necessary.

A plurality of substrates can be simultaneously introduced to the reaction vessel in FIGS. 2 through 4. For example, with a reaction vessel in the shape of a rectangular parallelepiped, four surfaces are provided with substrates, another substrate is used for putting in and taking out the substrates, and another surface for vacuum exhaust and the introduction of the first and the second reactive gas. In this case, too, each substrate is placed an equal distance from the gas inlet port to form a uniform thin film.

As explained above, the invention can be changed without departing from the scope of the invention.

The invention can achieve a better filling than with the prior art without causing radiation damage of insulation, semiconductor, metal, etc., to realize a flatness even for the trench with a high aspect ratio.

What is claimed is :

1. A thin film forming method, comprising the steps of:
    supporting a semiconductor substrate, having a trench or an unevenness thereon, in a reaction vessel;
    introducing a reactive gas into the reaction vessel;
    activating the reactive gas to form a deposit species, the deposit species characterized by a phase diagram including a liquid phase region defined by a melting curve and an evaporation curve that intersect at a triple point; and
    forming a thin film containing at least a part of the deposit species on the substrate while retaining a pressure in the reaction vessel higher than the triple point of the phase diagram of the deposit species, and retaining a temperature of the substrate within the liquid phase region of the phase diagram of the deposit species.
2. The thin film forming method of claim 1 wherein the step of activating the reactive gas includes the step of generating a plasma.
3. The thin film forming method of claim 1 wherein the step of activating the reactive gas includes the step of thermally activating the reactive gas.
4. The thin film forming method of claim 1 wherein the step of activating the reactive gas includes the step of light activating the reactive gas.
5. The thin film forming method of claim 1 wherein the step of activating the reactive gas includes the step of electron beam activating the reactive gas.
6. The thin film forming method of claim 4 wherein the step of light activating includes the step of laser beam activating the reactive gas.
7. The thin film forming method of claim 1 wherein the reactive gas includes an impurity to change the conductivity of the semiconductor substrate.
8. The thin film forming method of claim 1 wherein the aspect ratio of the trench is one or more.
9. The thin film forming method of claim 1 wherein the reactive gas is activated within the reaction vessel supporting the substrate therein.
10. The thin film forming method of claim 1 wherein the reactive gas is activated in a portion of the reaction vessel other than a portion supporting the substrate therein.
11. The thin film forming method of claim 1 wherein the thin film is an insulator.
12. The thin film forming method of claim 1 wherein the thin film is silicon oxide.
13. The thin film forming method of claim 1 wherein the thin film is a semiconductor.
14. The thin film forming method of claim 1 wherein the thin film is a polymer.
15. The thin film forming method of claim 1 wherein the thin film is a metal.
16. The thin film forming method of claim 1 wherein the substrate has a mask formed thereon.
17. The thin film forming method of claim 1 wherein the deposit species is heated.
18. The thin film forming method of claim 17 wherein the deposit species heating is instantaneous.
19. The thin film forming method of claim 1 wherein the supporting step comprises electrostatically supporting the substrate with a sample holder.
20. The thin film forming method of claim 1 wherein the substrate and the reactive gas are vibrated relatively.
21. The thin film forming method of claim 1 wherein the step of introducing the reactive gas includes the step of supplying a first reactive gas and a second reactive gas which is different than the first reactive gas.
22. The thin film forming method of claim 1 wherein the step of retaining the temperature includes the step of cooling the substrate.
23. The thin film forming method of claim 1 wherein the step of retaining the temperature includes the step of heating the substrate.
24. The thin film forming method of claim 21 wherein the first reactive gas is activated within the reaction vessel supporting the substrate therein.
25. The thin film forming method of claim 21 wherein the first reactive gas is activated in a portion of the reaction vessel other than a portion supporting the substrate therein.
26. The thin film forming method of claim 21 wherein the first reactive gas includes at least one of oxygen, nitrogen, hydrogen or a gas containing at least a halogen element.
27. The thin film forming method of claim 21 wherein the first reactive gas includes at least one of the inert gases.
28. The thin film forming method of claim 21 wherein the first reactive gas includes at least one of oxygen, nitrogen or hydrogen, and the second reactive gas includes at least one element included in the II to VI groups of the periodic table.
29. The thin film forming method of claim 21 wherein the first reactive gas includes at least one of hydrogen, nitrogen or a gas containing at least a halogen element and the second reactive gas includes at least one of an organic compound, halide or carbonyl of a metal or a semiconductor.

30. The thin film forming method of claim 21 wherein the second reactive gas includes one of tetramethyl silane, hexamethyldisiloxane or trimethyl silanol.

31. The thin film forming method of claim 30 wherein the first reactive gas is oxygen.

32. The thin film forming method of claim 31 wherein the flow ratio of the first reactive gas to the second reactive gas is 2 or more, the temperature of the substrate is between 20° C. and −100° C., and the total internal pressure of the reaction vessel is maintained at less than 10 Torr.

33. The thin film forming method of claim 36 wherein the step of activating includes the step of radiating a laser beam with a power of approximately 330 Joul/cm$^2$ sec.

34. The thin film forming method of claim 32 wherein the step of activating includes the step of radiating a laser beam with a wave length of approximately 200 nm or less and with a power of approximately 330 Joul/cm$^2$ sec.

35. The thin film forming method of claim 32 wherein a pressure in the reaction vessel and a temperature of the substrate are set at a condition where a contact angle of a liquefied globule of the second reactive gas and the substrate become acute.

36. The thin film forming method of claim 32 wherein after the deposit species is formed, the substrate is heated at approximately 300° C. or more with flowing oxygen or an oxygen radical.

37. The thin film forming method of claim 1, wherein the reactive gas is activated in one portion of the reaction vessel that is apart from another portion of the reaction vessel where the substrate is supported.

38. The thin film forming method of claim 21, wherein the first reactive gas is activated in one portion of the reaction vessel that is apart from another portion of the reaction vessel where the substrate is supported.

39. A thin film forming method, comprising the steps of:
   supporting a substrate to be treated, having a trench or an unevenness thereon, in a reaction vessel;
   exciting a first reactive gas outside of the reaction vessel;
   introducing the excited first reactive gas and a second reactive gas, different from the first reactive gas, into the reaction vessel;
   reacting the excited first reactive gas and the second reactive gas to form a deposit species, the deposit species characterized by a phase diagram including a liquid phase region defined by a melting curve and an evaporation curve that intersect at a triple point; and
   forming a thin film containing at least a part of the deposit species on the substrate while retaining a pressure in the reaction vessel higher than the triple point of the phase diagram of the deposit species, and retaining a temperature of the substrate within the liquid phase region of the phase diagram of the deposit species.

40. A thin film forming method, comprising the steps of:
   supporting a substrate to be treated, having a trench or an unevenness thereon, in a reaction vessel;
   exciting a first reactive gas outside of the reaction vessel;
   introducing the excited first reactive gas and a second reactive gas, different than the first reactive gas, into the reaction vessel;
   supplying thermal energy from the substrate to at least one of the first and second reactive gases introduced into the reaction vessel, to form a liquefied deposit species produced by a reaction of the first and second reactive gases; and
   flowing the liquefied deposit species onto a surface of the substrate to form a thin film on the substrate.

41. A thin film forming method, comprising the steps of:
   supporting a semiconductor substrate, having a trench or an unevenness thereon, in a reaction vessel;
   introducing a first reactive gas and a second reactive gas into the reaction vessel, the first and second reactive gases each being characterized by a respective phase diagram including a liquid phase region defined by a melting curve and an evaporation curve that intersect at a triple point; and
   reacting the first and second gases to form a thin film containing elements of the first and second reactive gases on the substrate while retaining a pressure in the reaction vessel higher than the triple point of the phase diagram of at least one of the first and second reactive gases, and retaining a temperature of the substrate within the liquid phase region of the phase diagram of at least one of the first and second reactive gases.

42. A thin film forming method, comprising the steps of:
   supporting a substrate to be treated, having a trench or an unevenness thereon, in a reaction vessel;
   exciting a first reactive gas outside of the reaction vessel;
   introducing the excited first reactive gas and a second reactive gas, different from the first reactive gas, into the reaction vessel, the first and second reactive gases each being characterized by a respective phase diagram including a liquid phase region defined by a melting curve and an evaporation curve that intersect at a triple point; and
   reacting the excited first reactive gas and the second reactive gas to form a thin film containing elements of the first and second reactive gases on the substrate while retaining a pressure in the reaction vessel higher than the triple point of the phase diagram of at least one of the first and second reactive gases introduced into the reaction vessel, and retaining a temperature of the substrate within the liquid phase region of the phase diagram of at least one of the first and second reactive gases.

* * * * *

UNITED STATES PATENT AND TRADEMARK OFFICE
CERTIFICATE OF CORRECTION

PATENT NO. : 5,385,763
DATED : January 31, 1995
INVENTOR(S) : Haruo OKANO et al

It is certified that error appears in the above-indentified patent and that said Letters Patent is hereby corrected as shown below:

Claim 33, Column 15, Line 16, "claim 36" should read --claim 30--.

Signed and Sealed this

Sixth Day of June, 1995

*Attest:*

BRUCE LEHMAN

*Attesting Officer*    *Commissioner of Patents and Trademarks*